United States Patent [19]
Distefano

[11] Patent Number: 5,937,276
[45] Date of Patent: Aug. 10, 1999

[54] BONDING LEAD STRUCTURE WITH ENHANCED ENCAPSULATION

[75] Inventor: Thomas H. Distefano, Monte Sereno, Calif.

[73] Assignee: Tessera, Inc., San Jose, Calif.

[21] Appl. No.: 08/947,180

[22] Filed: Oct. 8, 1997

Related U.S. Application Data

[60] Provisional application No. 60/033,075, Dec. 13, 1996.

[51] Int. Cl.$^6$ .......................... H01L 21/44; H01L 21/48; H01L 21/50
[52] U.S. Cl. .......................... 438/106; 438/127; 438/458
[58] Field of Search .................................. 438/106, 127, 438/455

[56] References Cited

U.S. PATENT DOCUMENTS

| | | |
|---|---|---|
| 2,758,797 | 8/1956 | Miklau . |
| 3,374,537 | 3/1968 | Doelp, Jr. . |
| 3,390,308 | 6/1968 | Marley . |
| 3,426,252 | 2/1969 | Lepselter . |
| 3,460,105 | 8/1969 | Birt et al. . |
| 3,487,541 | 1/1970 | Boswell . |
| 3,517,438 | 6/1970 | Johnson et al. . |
| 3,614,832 | 10/1971 | Chance et al. . |
| 3,680,037 | 7/1972 | Nellis et al. . |
| 3,680,206 | 8/1972 | Roberts . |
| 3,683,105 | 8/1972 | Shamash et al. . |
| 3,684,818 | 8/1972 | Netherwood . |
| 3,772,575 | 11/1973 | Hegarty et al. . |
| 3,795,037 | 3/1974 | Luttmer . |
| 3,822,465 | 7/1974 | Frankort et al. . |
| 3,832,769 | 9/1974 | Olyphant, Jr. et al. . |
| 3,862,790 | 1/1975 | Davies et al. . |
| 3,864,728 | 2/1975 | Peltz et al. . |
| 3,868,724 | 2/1975 | Perrino . |
| 4,030,657 | 6/1977 | Scheffer . |
| 4,069,961 | 1/1978 | Nicklaus . |
| 4,141,712 | 2/1979 | Rogers . |
| 4,179,802 | 12/1979 | Joshi et al. . |
| 4,234,666 | 11/1980 | Gursky . |
| 4,237,607 | 12/1980 | Ohno . |
| 4,312,926 | 1/1982 | Burns . |
| 4,320,570 | 3/1982 | Williams . |
| 4,331,740 | 5/1982 | Burns . |

(List continued on next page.)

FOREIGN PATENT DOCUMENTS

| | | |
|---|---|---|
| 0506112 | 9/1992 | European Pat. Off. . |
| 4142050 | 5/1992 | Japan . |
| 4155935 | 5/1992 | Japan . |
| 4162543 | 6/1992 | Japan . |
| 4245450 | 9/1992 | Japan . |
| 4287939 | 10/1992 | Japan . |
| WO 92/05582 | 4/1992 | WIPO . |
| WO 94/03036 | 3/1994 | WIPO . |

OTHER PUBLICATIONS

"Recent Advances in Single Point Tab Bonding Tools", by Jerry Carlson Microminiature Technology, Inc.

*Primary Examiner*—Kevin M. Picardat
*Assistant Examiner*—Devin Collins
*Attorney, Agent, or Firm*—Lerner, David, Littenberg, Krumholz & Mentlik, LLP

[57] ABSTRACT

A connection component for a semiconductor chip includes a support structure having a top surface including a dielectric material and a bottom surface. The support structure includes a central portion, a peripheral portion and one or more gaps extending substantially between the central portion and the peripheral portion. A bus overlies the top surface of the support structure. The each bus has an outer edge which overlies the peripheral portion of the support structure and an inner edge which overlies the one or more gaps. The support structure also includes one or more electrically conductive leads having first ends secured to the central portion and second ends overlying the gaps and being secured to the inner edge of the bus. The second ends of the leads are displaceable relative to the bus in response to bonding forces being applied to the leads for engaging contacts on a semiconductor chip.

18 Claims, 5 Drawing Sheets

U.S. PATENT DOCUMENTS

| | | |
|---|---|---|
| 4,380,042 | 4/1983 | Angelucci, Sr. et al. . |
| 4,413,404 | 11/1983 | Burns . |
| 4,435,741 | 3/1984 | Shimizu et al. . |
| 4,545,610 | 10/1985 | Lakritz et al. . |
| 4,574,470 | 3/1986 | Burt . |
| 4,604,644 | 8/1986 | Beckham et al. . |
| 4,616,406 | 10/1986 | Brown ..................................... 438/106 |
| 4,616,412 | 10/1986 | Schroeder . |
| 4,627,151 | 12/1986 | Mulholland et al. . |
| 4,628,406 | 12/1986 | Smith et al. . |
| 4,633,583 | 1/1987 | Kato . |
| 4,670,770 | 6/1987 | Tai . |
| 4,681,654 | 7/1987 | Clementi et al. . |
| 4,685,998 | 8/1987 | Quinn et al. . |
| 4,709,468 | 12/1987 | Wilson . |
| 4,710,798 | 12/1987 | Marcantonio . |
| 4,721,993 | 1/1988 | Walter . |
| 4,751,199 | 6/1988 | Phy . |
| 4,751,482 | 6/1988 | Fukuta et al. . |
| 4,756,080 | 7/1988 | Thorp, Jr. et al. . |
| 4,776,509 | 10/1988 | Pitts et al. . |
| 4,793,814 | 12/1988 | Zifcak et al. . |
| 4,796,078 | 1/1989 | Phelps, Jr. et al. . |
| 4,811,082 | 3/1989 | Jacobs et al. . |
| 4,812,421 | 3/1989 | Jung et al. . |
| 4,814,295 | 3/1989 | Mehta . |
| 4,855,867 | 8/1989 | Gazdik et al. . |
| 4,859,806 | 8/1989 | Smith . |
| 4,874,721 | 10/1989 | Kimura et al. . |
| 4,878,098 | 10/1989 | Saito et al. . |
| 4,884,122 | 11/1989 | Eichelberger et al. . |
| 4,887,758 | 12/1989 | Suzuki et al. . |
| 4,941,033 | 7/1990 | Kishida . |
| 4,967,261 | 10/1990 | Niki et al. . |
| 4,989,069 | 1/1991 | Hawkins . |
| 5,007,576 | 4/1991 | Congleton et al. . |
| 5,010,038 | 4/1991 | Fox et al. ................. 438/106 |
| 5,057,461 | 10/1991 | Fritz . |
| 5,059,559 | 10/1991 | Takahashi et al. . |
| 5,065,504 | 11/1991 | Olla . |
| 5,065,506 | 11/1991 | Kirbiyashi . |
| 5,127,570 | 7/1992 | Steitz et al. . |
| 5,148,166 | 9/1992 | Khandros et al. . |
| 5,148,265 | 9/1992 | Khandros et al. . |
| 5,148,967 | 9/1992 | Gabaldon et al. . |
| 5,156,318 | 10/1992 | Suzuki et al. . |
| 5,173,574 | 12/1992 | Kraus . |
| 5,177,863 | 1/1993 | Lam . |
| 5,193,732 | 3/1993 | Interrante et al. . |
| 5,217,154 | 6/1993 | Elwood et al. . |
| 5,225,633 | 7/1993 | Wigginton . |
| 5,252,784 | 10/1993 | Asai et al. . |
| 5,390,844 | 2/1995 | Distefano et al. . |
| 5,477,611 | 12/1995 | Sweis et al. . |
| 5,489,749 | 2/1996 | DiStefano et al. . |
| 5,536,909 | 7/1996 | DiStefano et al. . |
| 5,565,386 | 10/1996 | Bearden et al. ........................ 438/106 |
| 5,663,106 | 9/1997 | Karavakis et al. . |

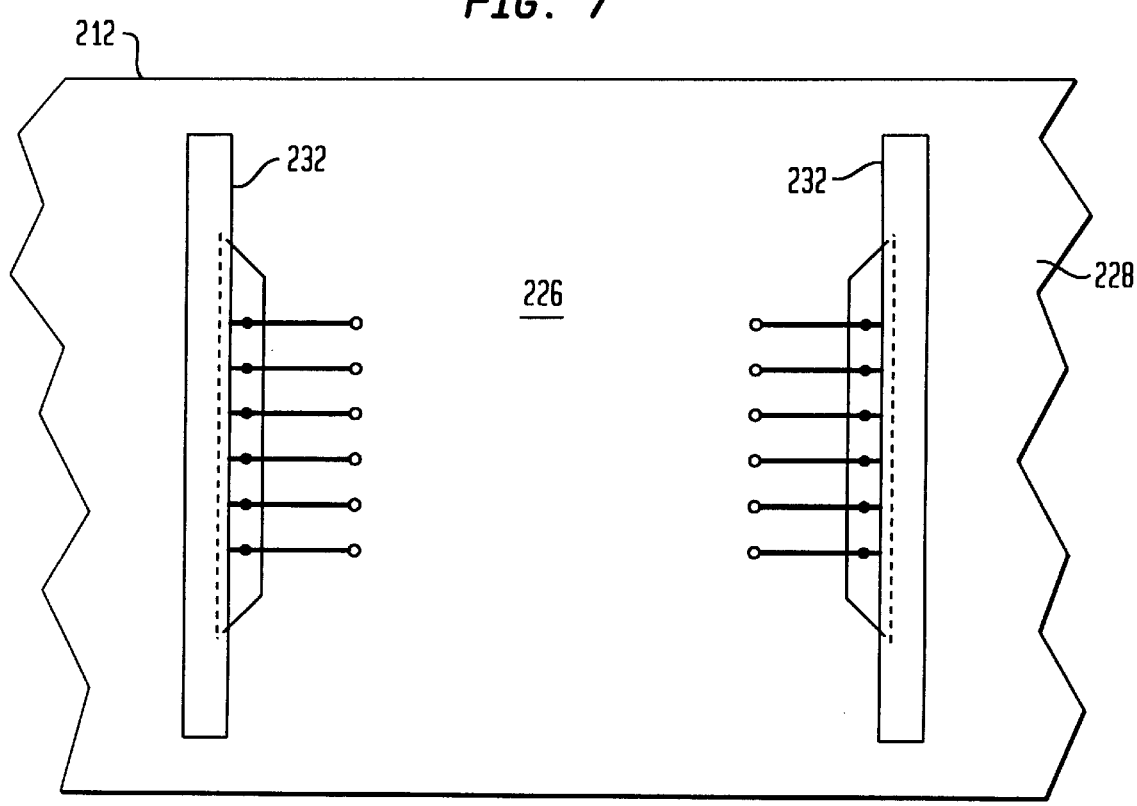

BONDING LEAD STRUCTURE WITH ENHANCED ENCAPSULATION

CROSS REFERENCE TO RELATED APPLICATION

This application claims benefit of U.S. Provisional Application Ser. No. 60/033,075 filed Dec. 13, 1996, the disclosure of which is incorporated by reference herein.

FIELD OF THE INVENTION

The present invention relates to components and methods useful in mounting and connecting semiconductor devices to external elements.

BACKGROUND OF THE INVENTION

Semiconductor chips typically are connected to external circuitry through contacts on a surface of the chip. The contacts on the chip typically are disposed in patterns such as an area array which substantially covers the front surface of the chip, or in elongated rows extending parallel to and adjacent each edge of the chip front surface. Each contact on the chip must be connected to external circuitry, such as the circuitry of a supporting substrate or circuit panel. Various processes for making these interconnections use prefabricated arrays of leads or discrete wires. For example, in the tape automated bonding ("TAB") process, a dielectric film, such as a thin foil of polyimide is provided with one or more bond windows. An array of terminals are provided on one surface of the dielectric film and leads connected to the terminals extend outwardly from a central portion of the dielectric film and overlie the bond windows. The dielectric film is juxtaposed with a semiconductor chip so that the bond windows are aligned with the chip and so that the outermost ends of the leads will extend over the contact bearing face on the chip. The outermost ends of the leads are then bonded to the contacts of the chip, as by ultrasonic or thermocompression bonding which in turn connects the contacts with terminals on the dielectric film. The chip is then connected to an external circuit element by connecting the terminals to contact pads on the external circuit element.

Commonly assigned International Application No. PCT/US93/06930 filed Jul. 23, 1993, the disclosure of which is incorporated herein by reference, discloses another connection component for a semiconductor chip. The connection component includes a support structure formed from dielectric materials such as polymeric materials. The support structure has a top surface and a bottom surface, a central portion, a peripheral portion and gaps extending from the top surface to the bottom surface of the support structure and between the central portion and the peripheral portion thereof. Each gap in the support structure may be formed as an elongated slot. The support structure also includes terminals on the central portion and leads having first ends connected to the terminals and second ends extending over the slots. The second ends of the leads are connected by a frangible section to an elongated bus extending over the peripheral portion of the support structure alongside each elongated slot. The bus reinforces the support structure and the leads when the component is assembled to a semiconductor chip. The bus is provided alongside each slot on the peripheral portion so that one such bus extends alongside each slot. The slots are connected to one another to form a substantially continuous channel surrounding the central portion, leaving the central portion connected to the peripheral portion only through the leads. During the connection process, the frangible sections of the leads are broken so that the leads are detached from the peripheral portion, thereby detaching the central portion from the peripheral portion and leaving the central portion connected to the chip. The terminals on the support structure are then connected to an external circuit element for electrically interconnecting the semiconductor chip to the external circuit element.

Certain designs have been found to improve the performance of chip packages comprising semiconductor chips and connection components. These designs reduce the amount of stress on the electrical components within the package by redistributing the thermal cycling stress into a portion of the chip package itself. An example of such a design is shown in U.S. Pat. Nos. 5,148,265 and 5,148,266, both disclosures of which are incorporated herein by reference. One disclosed embodiment of these patents shows the use of a connection component in combination with a compliant layer to reduce problems associated with thermal cycling. Typically, the compliant layer includes an elastomeric layer which, in the finished package, is disposed between the connection component and the contact bearing surface of the chip. The compliant layer provides resiliency to individual terminals on the connection component, allowing each terminal to move in relation to its electrically connected chip contact to accommodate thermal cycling as necessary during testing, final assembly and thermal cycling of the device.

It has also been found desirable to introduce encapsulating material between and/or around elements of the semiconductor packages in an effort to reduce and/or redistribute the strain and stress on the connections between the semiconductor chip and an external circuit element during operation of the chip, and to seal the elements against corrosion, as well as to insure intimate contact between the encapsulant, the semiconductor chip and the other elements of the chip package.

Thus, despite the substantial time and effort devoted heretofore to the problems associated with mounting and connecting semiconductor chips to external elements, there have still been substantial, unmet needs for improvements in such processes and in the equipment and components used to practice the same.

SUMMARY OF THE INVENTION

One aspect of the present invention provides a semiconductor chip connection component. A component according to this aspect of the invention includes a support structure having a top surface and a bottom surface, a central portion, a peripheral portion and one or more gaps extending through the support structure from the top surface to the bottom surface and substantially between the central portion and the peripheral portion. Preferably, the support structure is formed from dielectric materials such as polymeric materials and may have an appreciable thickness, i.e., an appreciable distance between the top surface and the bottom surface.

The connection component may include a bus overlying the top surface of the support structure. The bus has an outer edge which overlies the peripheral portion and an inner edge which overlies the one or more gaps so that the inner edge of the bus is aligned over the one or more gaps. In certain embodiments, the bus may include a plurality of metallic bars connected to one another to cooperatively form a hoop-like structure having an inner edge aligned over the one or more gaps. In other embodiments, the bus may include two metallic bars on opposite sides of the central portion which are substantially parallel to one another Typically, the bus is at least 50 microns wide and preferably between about 50 and about 200 microns wide and has a thickness of about 10 to 30 microns and more preferably about 25 microns.

The component further includes one or more electrically conductive flexible leads overlying the top surface of the support structure. Preferably, each lead comprises a first end securement section integrally connected to a terminal on the central portion of the support structure, a second end securement section integrally connected to the inner edge of the bus, a connection section disposed between the first end securement section and the second end securement section, the connection section having a first end integrally connected to the first end securement section and a second end connected to the second end securement section, and a frangible element connecting the second end of the connection section to the second end securement section. The frangible section of each such lead may have a cross-sectional area smaller than the cross-sectional area of the second end securement section and smaller than the cross-sectional area of the connection section. The frangible sections can be broken upon downward displacement of the connection sections toward the contacts on a semiconductor chip. The connection section of each lead defines a pair of opposed horizontal edges and the frangible section of each lead includes a pair of notches extending horizontally inwardly from the opposed edges to define a neck having a width less than the width between the opposed edges. The width of each lead between the opposed edges is between approximately 15–125 microns and the width of each said neck is approximately 12–40 microns. Generally, the flexible leads gradually widen out when moving along the lengthwise axis of the lead from the neck toward the central portion of the support structure. In certain preferred embodiments, the width between the opposed edges of the lead at the second end of the connection section (i.e., in the bonding area) is approximately 50 microns and the width between the opposed edges of the lead adjacent the central portion of the support structure is approximately 100 microns. The pair of notches in each said neck are generally V-shaped or U-shaped and define an angle of approximately 60–140 degrees.

The support structure may also include one or more bridge elements which are disposed at spaced apart locations around the periphery of the central portion for integrally connecting the central portion of the support structure and the peripheral portion together. Thus, the central portion is connected to the peripheral portions through both the conductive leads and the bridge elements. After the leads have been broken away from the inner edge of the bus, the central portion will remain connected to the peripheral portion only through the one or more bridge elements. For example, in certain embodiments the semiconductor chip includes rows of peripheral contacts which form a generally rectangular pattern around the chip. The rectangular pattern of contacts has corners and the rows of peripheral contacts extend into the corners, whereby the one or more bridge elements overlie the contacts which are disposed in the corners. In these embodiments the leads may elbow or extend around an edge of one of the gaps in order to span the gap and come into alignment with one of the respective chip contacts. However, most preferably the rows of peripheral contacts terminate before the corners thereof so that the corners are substantially devoid of any contacts. In these most preferred embodiments, the one or more bridge elements do not overlie any of the contacts.

The support structure is formed from dielectric materials so that the support structure does not electrically interconnect the leads with one another. The connection section of each lead is supported above the front face of the semiconductor chip or substrate by the support structure before such connection section is displaced downwardly to engage a contact. In certain preferred embodiments, the support structure includes a resilient element or compliant layer between the top surface and the bottom surface for permitting displacement of the terminals. The bus overlying the periphery of the support structure serves to reinforce the support structure and the leads, and maintain accurate alignment of the leads with the contacts when the connection component is assembled to a semiconductor chip.

After the leads have been bonded to the contacts on the semiconductor chip, the central portion of the support structure remains connected to the peripheral portion via the bridge elements, The inner edge of the bus and the second end securement sections integrally connected thereto extend over the inner edge of the peripheral portion and are aligned in the gaps. During an encapsulation process, as will be discussed in more detail below, the inwardly protruding edge of the bus and the second end securement section integrally connected thereto are readily wetted by an encapsulant. This promotes filling of the encapsulant around the second end securement section of the leads and the bus. When the one or more buses do not protrude over the inner edge of the peripheral portion, then the encapsulant does not readily wet to the one or more gap between the central portion and the peripheral portion. As a result, the completed assembly may have a void adjacent the inner edge of the bus and the second end securement sections connected thereto. The presence of voids cause the completed semiconductor chip assembly to have an unattractive appearance. Further, the appearance of the assembly can present a functional issue. The small voids which form around the second end securement sections typically do not extend to the contacts or to the connection sections. By themselves, they do not impair function of the assembly. However, these small voids can obscure the presence of larger voids, and can make it difficult to inspect the assembly. In contrast, the semiconductor chip assembly according to preferred embodiments of the present invention is completely encapsulated (i.e., there are no voids adjacent the periphery of the chip and the chip contacts), thereby providing the chip assembly with a neat, void free appearance in the gap. Moreover, by providing a support structure including a bus bar which extends inwardly into the gap between the central portion and the peripheral portion, the present invention provides a physically protective "frame" around the edge of the semiconductor chip assembly when the finished assembly is severed from the carrier tape. The "frame" provides rigidity around the periphery of the chip package while enabling the central portion to remain flexible. As a result the rigid portion of the package can be easily handled by "pick and place" equipment during final assembly of the chip to an external circuit element, such as a printed circuit board. As will be described in more detail below, the assembly is severed from the tape by cutting along a severance plane outside the periphery of the bus.

A further aspect of the invention provides methods of making a semiconductor chip assembly. Methods according to this aspect of the invention preferably include the steps of providing a connection component including a support structure having a top surface including a dielectric material and a bottom surface. The support structure according to this method includes a central portion, a peripheral portion and one or more gaps extending through the support structure from the top surface to the bottom surface and between the central portion and the peripheral portion. The support structure also includes a bus overlying the top surface of the support structure and having an outer edge overlying the peripheral portion and an inner edge overlying the one or more gaps, and one or more electrically conductive leads overlying the top surface of the support structure and having a first end secured to the central portion, and a second end secured to the inner edge of the bus. Each lead includes a first end securement section integrally connected to one of the terminals on the central portion of the support structure, a second end securement section integrally connected to the inner edge of the bus, a connection section disposed between the first end securement section and the second end securement section, the connection section having a first end integrally connected to the first end securement section and a second end connected to the second end securement section and a frangible section connecting the second end of the connection section to the second end securement section.

The method desirably further includes the steps of juxtaposing the support structure with a semiconductor chip including a front face having contacts so that the bottom surface of the support structure opposes the front face of the chip and bonding each connection section to a contact on the semiconductor chip by displacing each connection section downwardly relative to the support structure. Preferably, the bonding step is performed so as to detach one end of each connection section from the bus during the downward displacement of the connection section as, for example, by breaking the frangible section of each lead or detaching a bond between the lead and the bus. After the lead has been broken from the bus during the bonding step, the second end securement section of each lead remains integrally connected to the inner edge of the bus and projects slightly toward the front face of the semiconductor chip. In the next stage of the process, a curable liquid material, such as a curable silicone elastomer, may be allowed to flow between the semiconductor chip and the support structure, whereby the curable liquid material wets to the inner edge of the bus and the second end securement section integrally connected thereto. The curable liquid material is then cured to encapsulate the semiconductor chip assembly, including the leads. In one preferred embodiment, the step of allowing a curable material to flow includes the steps of attaching a protective layer, such as a coverlay or mask, on the top surface of the support structure so that the protective layer covers the one or more gaps extending through the support structure and then depositing a curable liquid material around at least a portion of the periphery of the semiconductor chip so as to encapsulate the bonded leads. The finished assembly may then be singulated or prepared for being assembled to an external circuit element, such as a printed circuit board, by removing the excess polymer material outside of the bus. This may be accomplished by cutting away the excess polymer layer along a severance plane outside the bus.

The foregoing and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 7 is a diagrammatic view depicting a connection component in accordance with another embodiment of the invention.

DETAILED DESCRIPTION OF THE PREFERRED EMBODIMENTS

Figure 1:
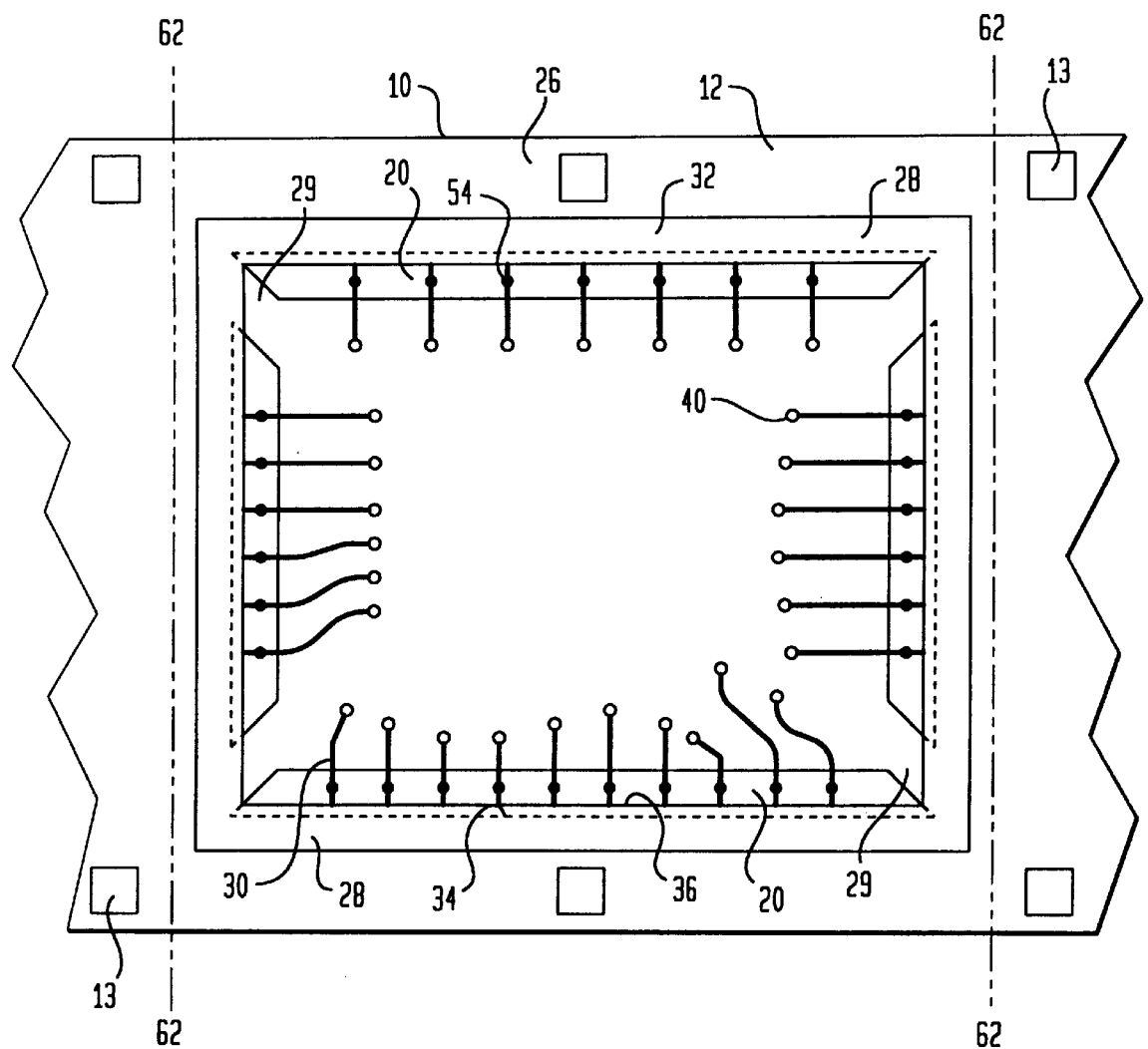
FIG. 1 is a diagrammatic view depicting a connection component in accordance with one embodiment of the invention.

Referring to FIGS. 1–4, one embodiment of the present invention comprises a plurality of connection components including support structures 10 which are provided on a tape 12 used in tape automated bonding processes. The tape 12 is provided with sprocket holes 13 to facilitate feeding and movement of the support structures 10 during processes for making semiconductor chip packages. The support structure 10 of each component incorporates a flexible, sheet-like top dielectric layer 16 and a bottom, resilient or compliant layer 18. The flexible top dielectric layer 16 may be about 0.01 to about 0.1 mm thick, whereas the bottom layer 18 may be about 0.05 to about 1.0 mm thick. The terms "top" and "bottom" are used herein to indicate directions relative to the structure of the connection component itself. It should be understood as referring to the frame of reference of the component itself, and not to the ordinary, gravitational frame of reference. Likewise, the terms "upwardly" and "downwardly" should also be understood as referring to the frame of reference of the component itself.

Figure 2:
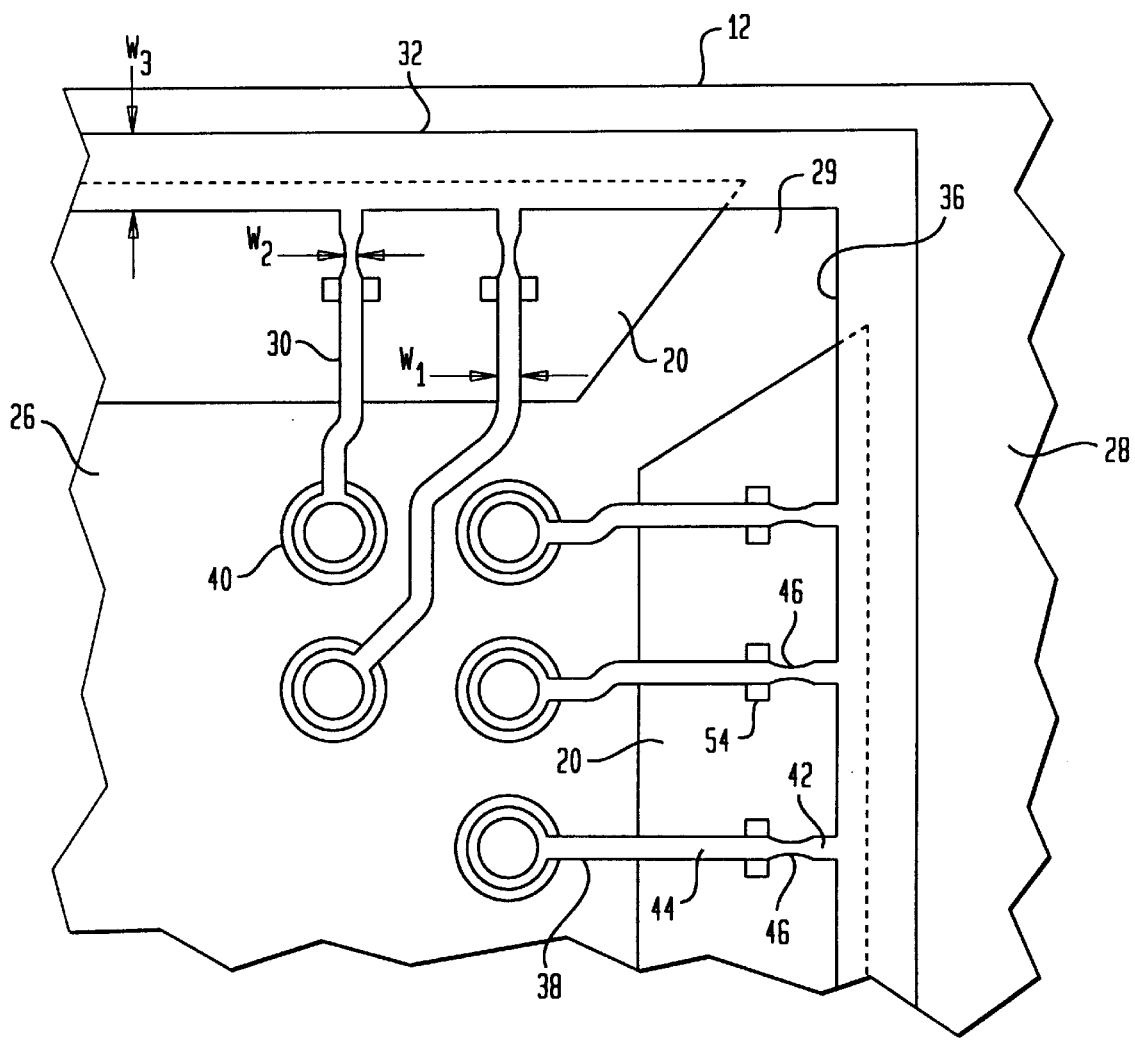
FIG. 2 is a fragmentary sectional view depicting a portion of the component of FIG. 1.

In one preferred embodiment, the support structure 10 has gaps 20 in the form of elongated channels extending through the support structure 10. The gaps 20 extend from the top surface 22 of the support structure 10 to the bottom surface 24 thereof. The gaps 20 subdivide the support structure 10 into a central portion 26 substantially bounded by the gaps 20 and strip-like peripheral portions 28 disposed outside of the gaps 20. As best seen in FIGS. 1 and 2, the gaps 20 define a generally rectangular pattern. However, such gaps 20 can be of any shape, in which case the flexible leads 44 may elbow or extend around an edge of one of the gaps in order to span the gap and come into alignment with one of the respective chip contacts. Such leads are disclosed in commonly assigned U.S. patent application Ser. No. 08/736,415 filed Oct. 24, 1996, the disclosure of which is incorporated herein by reference.

The central portion 26 is connected to the peripheral portion 28 by bridge elements 29 disposed at the corners of the central portion 26. The bridge elements 29 are disposed at spaced-apart locations around the periphery of the central portion 26. Preferably, the central portion 26, the peripheral portion 28 and the bridge elements 29 are formed as an integral unit. All of these components may be portions of a unitary sheet of dielectric material. Thus, the central portion 26, the peripheral portion 28 and the bridge elements 29 may all be formed as part of an elongated tape 12 (FIG. 1) which may include several connection components. The tape 12 may also include waste or trim areas outside the periphery of the support structure. The semiconductor chip 50 used in this particular embodiment includes four rows of peripheral contacts 54, the rows forming a generally rectangular pattern. However, the rows of peripheral contacts 54 terminate before the corners of this rectangular pattern, so that the corner regions of the pattern are substantially devoid of contacts 54. The bridge elements 29 overlie these corner regions, and hence do not cover any of the contacts 54.

The support structure 10 includes an elongated metallic bus 32 which overlies the inner edge 34 of the peripheral portion 28 of the support structure 10 so that the inner edge 36 of the bus 32 projects or extends inwardly into the gaps 20. The bus 32 extends inwardly (i.e., toward the central portion 26 of the support structure 10), from the inner edge 34 of the peripheral portion 28 to provide a lip or flange running inside of the inner edge 34 of the peripheral portion 28. The bus 32 includes a plurality of metallic bars connected to one another to cooperatively form a generally rectilinear, hoop-like structure encircling the central portion 26 of the support structure 10 and extending along the gaps 20. As shown in FIG. 7, in other embodiments, the bus 232 may include two metallic bars on opposite sides of the central portion 226 which are substantially parallel to one another.

Referring to FIGS. 1–4, the support structure 10 includes one or more flexible leads 30 having first ends 38 which are permanently connected to terminals 40 on the central portion 26 of the support structure and second ends which are detachably connected to the bus 32. Each lead 30 includes a first end securement section 38 integrally connected to a terminal 40 on the central portion 26; a second end securement section 42 integrally connected to the inner edge 36 of the bus 32; a lead connection section 44 disposed between the first end securement section 38 and the second end securement section 42 and having a first end integrally connected to the first end securement section 38 and a second end overlying one of the gaps 20 and being connected to the second end securement section 42. A frangible element 46 joins to second end of the connection section and the second end securement section 42. Referring to FIGS. 1 and 2, the connection sections 44 of all of the leads 30 associated with any given gap 20 extend generally perpendicular to the lengthwise dimension of the gap 20 and are generally in a side-by-side parallel relationship to one another. The spacings between adjacent connection sections 44 are selected so that the center-to-center distances between connection sections 44 are equal to the center-to-center distances between contacts 54 on the semiconductor chip. Thus, the center-to-center distances between adjacent connection sections 44 in a given gap 20, measured in the lengthwise direction of the gap 20, transversely to the directions of elongation of the connection sections 44, may be about 0.5 mm or less and may preferably be about 0.25 mm or less. Also, the dimensions of support structure 10, including the distances between gaps 20 are likewise selected to match the distances between the rows of contacts on the semiconductor chip. Preferred embodiments of the present invention may also incorporate the lead structures disclosed in the '415 application which shows various lead embodiments for accessing contacts on a semiconductor chip.

The dimensions and configuration of the leads 30 will vary somewhat depending upon the materials of construction and depending upon the desired application. Generally the leads 30 include a highly conductive metal such as copper or gold. In certain preferred embodiments, the leads include a composite of copper wrapped in gold, whereby the copper portion is approximately 15–16 microns thick and the gold is approximately 1 micron thick to give the lead an overall thickness of approximately 18 microns. Referring to FIG. 2, the width $w_1$ or dimension between the opposed edges of the lead 30 in the direction transverse to the length of the connection section 44 may be between about 15 microns and about 38 microns. The second end securement section 42 may have a similar width. The frangible section 46 of each lead 30 may be defined by a pair of notches extending inwardly from the opposed edges of the lead 30. Each such notch may have a pair of angularly arranged edges defining a generally V-shaped or U-shaped notch with an angle desirably between about 60 degrees and about 140 degrees. The width $w_2$ of the frangible section 46 in the notch, i.e., the smallest dimension of the neck in the direction transverse to the length of the connection section 44, may be between about 12 microns and about 40 microns. Most preferably, the leads 30, including the connection sections 44 have a thickness or vertical extent perpendicular to the plane of the dielectric layer 16 (perpendicular to the plane of the drawings in FIGS. 1 and 2) of about 10 to about 30 microns and most desirably about 15–25 microns. Preferably, each bus 32 has a width $w_3$ of at least about 50 microns and more preferably between about 100 and about 200 microns and a thickness of about 10 to about 30 microns and more preferably about 15–25 microns.

Figure 3:
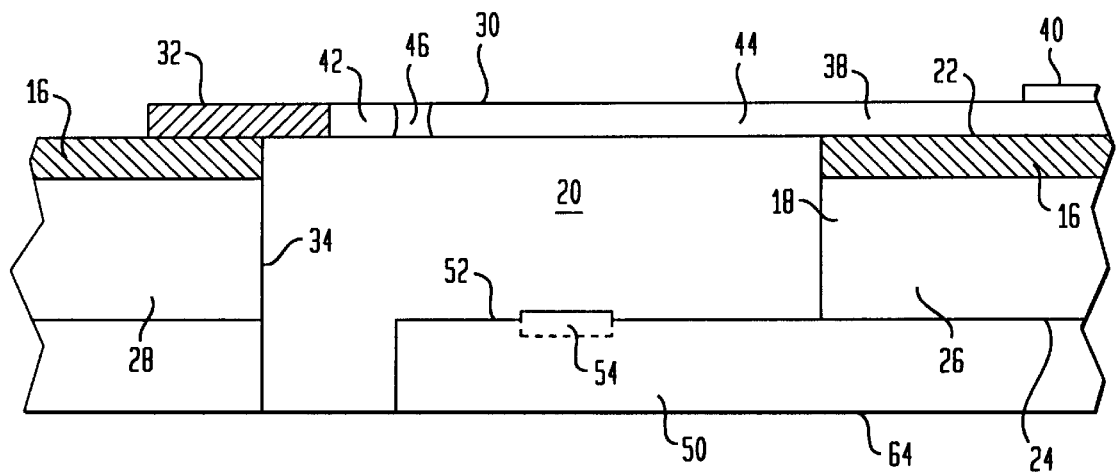
FIG. 3 is a diagrammatic side view of a semiconductor connection component in accordance with one embodiment of the invention.
Figure 4:
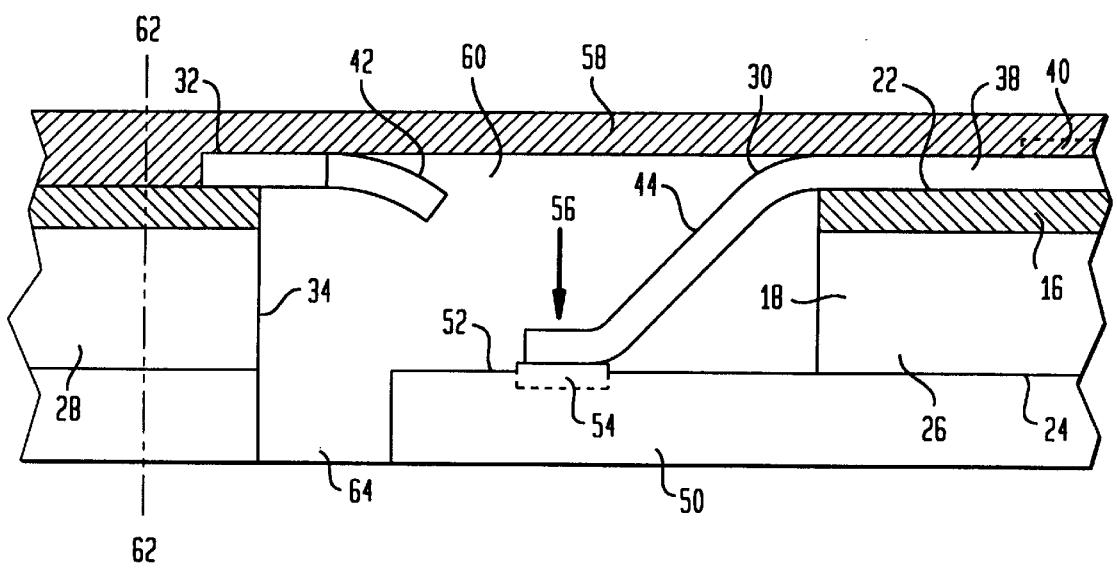
FIG. 4 is a diagrammatic side view of the component illustrated in FIG. 3.

The connection component also includes a plurality of central terminals 40 disposed over the central region 26 of the support structure 10. For clarity of illustration, the drawings depict only a relatively small number of central terminals 40; however, in actual practice, there may be hundreds or even thousands of terminals 40. Each central terminal 40 is disposed on the top surface of the support structure 10 and is associated with a first end securement section 38. The first end securement section 38 associated with each such central terminal 40 is formed integrally with that central terminal 40 and extends outwardly across one of the gaps 20 towards the elongated, electrically conductive bus 32. Components as illustrated in FIGS. 3–4 may be formed by processes similar to those described in U.S. patent application Ser. No. 07/919,772 filed Jul. 24, 1992, the disclosure of which is incorporated herein by reference. In other embodiments, the central terminals 40 may be disposed between the top surface 16 and the bottom surface 18, whereby vias are present for providing access to the terminals 40 at the top surface 16.

The connection component of FIGS. 3–4 may be employed with a semiconductor chip 50 having a generally planar front face 52 including electrical parts or contacts 54 formed on peripheral regions of the front face 52. The contacts 54 are arranged in rows (not shown) which are adjacent, and run parallel to, each edge of the chip 50. The contacts 54 in each row are spaced at very close intervals, typically about 100 to about 250 micrometers center-to-center. This center-to-center spacing is adequate for high I/O count chips used with wire bonding or tape automated bonding systems. In the embodiment shown, the rows of peripheral contacts are arranged in a generally rectangular pattern having corners. The rows of peripheral contacts terminate before the corners so that the corners are substantially devoid of contacts. The one or more bridge elements described above overlie the corners of the pattern.

In one assembly process according to an embodiment of the present invention, the support structure 10 and the semiconductor chip 50 described above are juxtaposed with one another and assembled together so that the bottom surface 24 of the support structure 10 confronts and abuts the front face 52 of the chip 50 and the top surface 22 of the support structure 10 faces away from the chip 50. The gaps 20 in the support structure 10 are substantially aligned with the rows of contacts 54 on the chip 50. Thus, the lengthwise direction of each gap 20 extends generally parallel to the lengthwise axis of the aligned row of contacts 54. The connection sections 44 of the leads 30 extend generally perpendicular to the lengthwise axis of the gaps 20.

In the next stage of the process, the leads 30 are connected to the contacts 54 on the front face 52 of the chip 50 by a sequential bonding process, or by a bonding operation as shown in U.S. Pat. Nos. 5,398,863; 5,390,844; 5,536,909 and 5,491,302. Once a bonding tool (not shown) and the contact 54 of the chip 50 are in alignment, the tool is advanced in the direction indicated by arrow 56 in FIG. 4, so as to force the connection section 44 of the most closely aligned lead 30 toward contact 54. As the tool moves downwardly under the influence of forces applied by the bonding tool, it displaces the connection section 44 downwardly relative to the support structure 10 of the connection component. As the second end of the connection section 44 is forced downwardly, frangible section 46 breaks, thereby freeing the second end of the connection section 46 from the second end securement section 42 and from the bus bar 32. The second end securement section 42 remains attached to the bus bar 32 after the lead 30 is broken away from the frangible section 44 and generally projects toward the chip 50. The first end of the connection section 44, adjacent the first securement section 38, bends downwardly so that the second end of the connection section 44 can be forced into engagement with the contact 54 by the tool. As the tool forces the connection section 44 into engagement with the contact 54, heat and/or ultrasonic vibrations may be applied by the bonding apparatus through the tool so as to cause the connection section 44 to bond to the contact 54. During the bonding step, as the bonding tool engages each lead 30 and forces it downwardly, the load applied to fracture the frangible section 46 is distributed by the bus 32 and/or the peripheral portion 28 of the support structure 10. This tends to maintain the second end securement section 42 of each lead 30 securely in position and thereby facilitates breakage of the frangible sections 46.

In the next stage of the process, the semiconductor chip and the connection component may be encapsulated by a known encapsulation process, or by the encapsulation processes disclosed in commonly assigned U.S. patent application Ser. No. 08/726,697 filed Oct. 7, 1996, the disclosure of which is incorporated herein by reference. In accordance with this process, a protective layer such as a mask layer or coverlay 58 is placed over the top surface of the support structure to cover the gaps and the terminals. A liquid encapsulant, such as a curable silicone elastomer, is then deposited around at least a portion of the periphery of the semiconductor chip to encapsulate the bonded leads. In one particular embodiment, the encapsulant 60 is introduced from the back side of the chip 50, e.g. the side opposite the front face 52 of the chip 50. The encapsulant 60 is dispensed so that the level of the encapsulant 60 is just below the plane of the back surface of the chip 50. The coverlay 58 is preferably made of a photosensitive dielectric polymer material such as DuPont Pryralux PC 1025. The coverlay 58 is further typically adhesively attached to the dielectric layer 16, such as by using a vacuum lamination technique well known to those skilled in the art, so that the terminals 40 are protected from the encapsulant material 60 which is subsequently deposited, as described below. This can be accomplished by vacuum laminating the coverlay 58 over the terminals 40 or by providing apertures in the coverlay 58 which are aligned with the terminals 40 so that the terminals may be disposed therein. For purposes of clarity, FIGS. 3 and 4 show the terminals 40 as being relatively higher than the leads 30 connected thereto; however, preferably the terminals 40 are substantially flat pads on the top surface 22 of the dielectric layer 16, and may just be an extension and broadening out of leads 30. In such a flat terminal embodiment, a photosensitive coverlay 58 may be adhered to the top surface 22 of the dielectric layer 16 so that the portions of the coverlay 58 overlying the terminals 40 may be removed using photolithographic techniques at a later time.

Once the semiconductor chip assembly has been positioned and attached to the coverlay 58, the encapsulant 60 is introduced into the open area between the front face 52 of the semiconductor chip 50 and the dielectric sheet 16. The encapsulant 60 is comprised of a curable liquid material which will allow the leads 30 to "flex" after the encapsulant 60 has been cured in response to thermal cycling forces during operation of the finished package. In preferred embodiments, the encapsulant 60 includes an electronic grade silicone-based or epoxy-based resin; although, other materials may be used. The specific curing mechanism used for the encapsulant 60 will depend on the particular encapsulant material used so that the encapsulant 60 may be cured or partially cured. Typical curing mechanisms such as radiant energy, thermal energy, moisture or ultraviolet light may be utilized.

During the encapsulation process, the inner edge 36 of the bus 32 and the second end securement section 42 are wetted by the curable liquid. This promotes filling of the encapsulant around the second end securement section 42 and the bus 32. The resulting semiconductor package assembly is fully encapsulated and has a neat, void free appearance in the gaps 20. As described above, the absence of voids around the second end securement section 42 makes it easier to inspect the rest of the assembly for the presence of larger voids. In addition, the bus forms a physically protective "frame" around the edge of the package assembly which provides "localized rigidity" around the periphery of the assembly while enabling the central portion of the assembly (i.e., the portion bearing the terminals) to remain flexible. The existence of "localized rigidity" at the periphery enables the package to be more easily handled by standard "pick and place" equipment when the package is being connected to a external circuit element, such as a printed circuit board. The finished assembly may then be singulated for use by cutting the tape 12 along a severance plane 62 outside of the bus bar 32. For example, a dicing means (such as a dicing saw, water jet, ultrasonic knife, rotary razor, laser, etc.) may be employed to separate the encapsulated chip assembly structure so that the resultant chip package is no wider or only slightly wider than the periphery of the chip 50 itself. This allows for the option of having a protective "bumper" 64 of cured encapsulant material around the periphery of the semiconductor chip. The bumper 64 protects the edges of the chip 50 and the metallurgy of the joint between the leads 30 and the contacts 54. The bumper 64 also provides added durability to the package by protecting the sides of the chip 50. The semiconductor chip package may then be electrically interconnected to a printed circuit board ("PCB") using a suitable conductive bonding material, such as eutectic solder.

Figure 5:
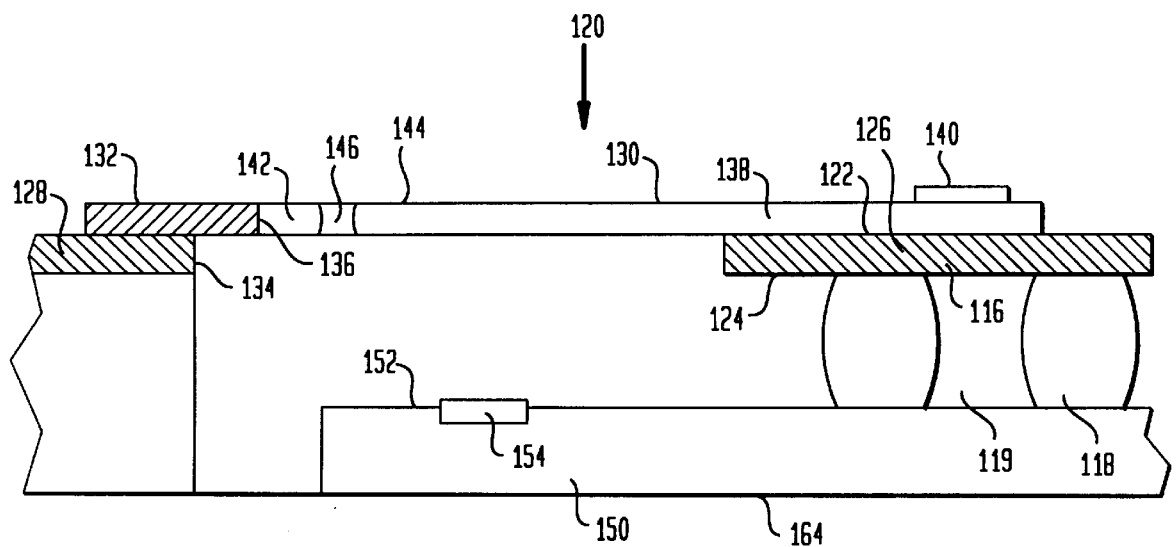
FIG. 5 is a diagrammatic side view of a connection component in accordance with another embodiment of the invention.
Figure 6:
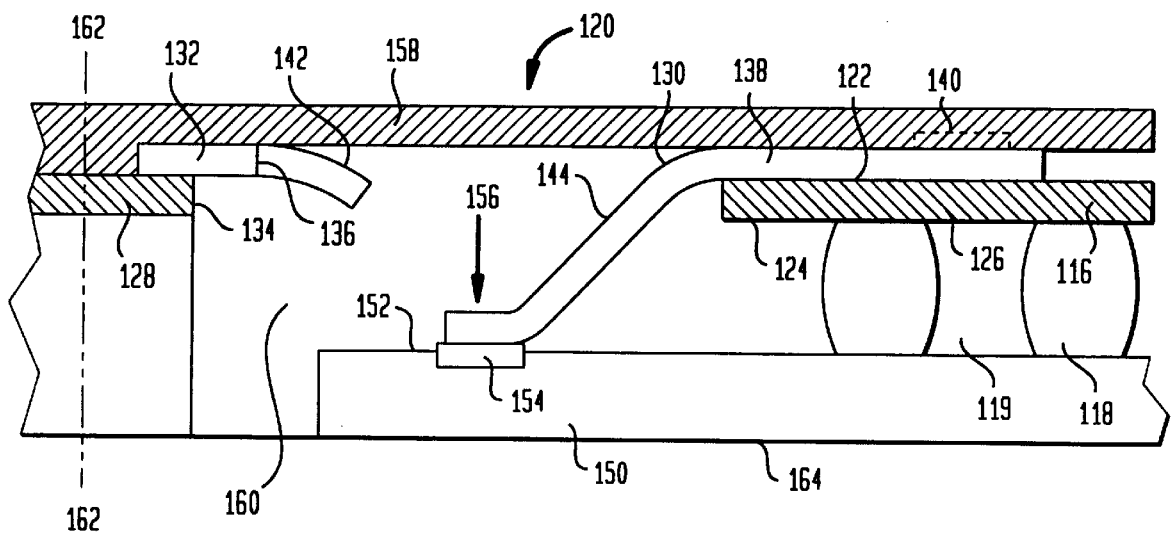
FIG. 6 is a diagrammatic side view of the connection component illustrated in FIG. 5.

Referring to FIGS. 5 and 6, in another preferred embodiment of the present invention a connection component includes a support structure and a resilient layer including a plurality of compliant pads 118 defining channels 119 therebetween whereby an encapsulant 160 is allowed to flow in the channels 119 between the pads 118 after the connection component has been assembled to a semiconductor chip. The encapsulant is then cured whereby the pads 118 and 160 encapsulant provide a compliant layer. As discussed above, the compliant layer provides an assembly which is able to withstand stresses resulting from expansion and contraction of the chip during operation. In accordance with this embodiment, the support structure 110 includes a sheet-like dielectric film 116 having a first surface 124 and a second surface 122. The dielectric film 116 is preferably formed from a polymeric material, such as KAPTON®(E) available from DuPont Chemical Corporation of an approximate thickness between 25 microns and 75 microns.

The dielectric film 116 has bond windows 120 in the form of elongated channels (substantially similar to those shown in FIGS. 1–4) extending therethrough from the first surface 124 to the second surface 122. The bond windows 120 divide the dielectric film 116 into a central portion 126 substantially bounded by the bond windows 120 and strip-like peripheral portions 128 disposed outside of the bond windows 120. As described above, the central portion 126 is connected to the peripheral portion 128 via bridge elements (not shown) disposed at spaced-apart locations on the periphery of the central portion 126.

The support structure includes a bus 132 which overlies the inner edge 134 of the peripheral portion 128 of the dielectric film 116 so that the inner edge 136 of the bus 132 projects or extends inwardly into the bond windows 120. The bus 132 provides a lip or flange running inside of the inner edge 134 of the peripheral portion 128. In certain embodiments, the bus 132 comprises a plurality of metal bars which cooperatively form a generally rectangular, hooplike structure encircling the central portion 126 of the dielectric film 116.

The support structure includes leads 130 having first ends 138 which are connected to terminals 140 on the dielectric film 116 and second ends which are detachably connected to the bus bar 132. Each lead 130 includes a first end securement section 138 integrally connected to the terminal 140 on the central portion 126; a second end securement section 142 integrally connected to the inner edge 136 of the bus bar 132; a lead connection section 144 disposed between the first end securement section 138 and the second end securement section 142, and a frangible element or section 146 joined to a second end of the connection section and the second end securement section 142. The connection sections 144 of all of the leads 130 associated with any given bond window 120 extend generally perpendicular to the lengthwise dimension of the bond window 120 and are generally in a side-by-side parallel relationship to one another. Before the connection sections 144 of the leads 130 are detached from the bus 132, all of the leads 130, and hence, all of the terminals 140 on the dielectric film 116, are electrically interconnected.

The resilient element comprises a plurality of compliant pads 118 which are disposed on the first surface 124 of the dielectric film 116 as described in commonly assigned U.S. patent application Ser. No. 08/365,699, filed Dec. 29, 1994, the disclosure of which is incorporated herein by reference. The resilient element 118 is typically made of a curable liquid elastomer material, such as a silicone elastomer. One material currently being used as a silicone elastomer is SYLGARD 577 manufactured by Dow Corning. The resilient element 118 may be formed in a mold or by using a stencil mask procedure.

The semiconductor chip 150 is substantially similar to that described in the embodiments disclosed above. The chip 150 has a generally planar front face 152 including electrical parts or contacts 154 formed on peripheral regions of the front face 152 and is assembled with the dielectric film 116 so that the plurality of compliant pads 118 are disposed between the front face 152 of the semiconductor chip 150 and the first surface 124 of the dielectric film 116. The semiconductor chip 150 also has a rear face 164 which faces away from the dielectric film 116. The rear face 164 may be attached to an external element, such as a heat sink, for dissipating heat from the chip assembly.

After the resilient element 118 has been assembled to the chip 150, the bond windows 120 overlie the peripheral contacts 154 on the chip so the leads 130 may be bonded to the contacts 154 on the chip. Once a bonding tool (not shown) and one of the contacts 154 of the chip 150 are in alignment, the tool is advanced in the direction indicated by arrow 156 in FIG. 6, so as to force the connection section 144 of the most closely aligned lead 130 toward contact 154. The tool displaces the connection section 144 downwardly relative to the dielectric film 116. As the second end of the connection section 144 is forced downwardly, frangible section 146 breaks, thereby freeing the second end of the connection section 146 from the second end securement section 142 and from the bus 132. The second end securement section 142 remains attached to the bus 132 after the lead 130 is broken away from the frangible section 144 and generally projects toward the chip 150. The first end of the connection section 144, adjacent the first securement section 138, bends downwardly so that the second end of the connection section 144 can be forced into engagement with the contact 154 by the tool. The central portion 126 of the support structure 110 remains connected to the peripheral portion 128 via the bridge elements (not shown).

In the next stage of the process, a low elastic modulus dielectric encapsulant or compliant filler 160, such as a liquid silicone rubber or other curable liquid elastomer, is allowed to flow between the dielectric film 116 and the chip 150. A mask or coverlay 158 may be placed over the gaps 120 to prevent the encapsulant 160 from flowing through the bond windows 120 when the encapsulant 160 is introduced between the chip 150 and the dielectric film 116. The encapsulant 160 readily wets to the inner edge of the bus 132 and the second end securement section 142 so that the area around the bus is completely filled and void free which avoids the problems discussed above. The encapsulant 160 also flows between the compliant pads 118 and around the leads 130 while the chip 150 and the dielectric film 116 are compressed together or held in place. The encapsulant 160 is then cured by energy such as heat, ultraviolet light or other radiant energy to form a substantially uniform, planar, compliant layer between the chip 150 and the support structure. The finished semiconductor chip package can then be singulated by severing the package from the tape along a severance plane 162 lying outside the periphery of the bus 132.

As these and other variations, combinations and modifications of the features discussed above can be employed without departing from the present invention, the foregoing description of the preferred embodiments should be taken by way of illustration rather than by way of limitation of the present invention as defined by the claims.

I claim:

1. A method of making a semiconductor chip assembly comprising the steps of:

(a) providing a connection component including a support structure having a top surface including a dielectric material and a bottom surface, said support structure including a central portion and a peripheral portion and one or more gaps extending through said support structure from said top surface to said bottom surface and between said central portion and said peripheral portion, a bus overlying the top surface of said support structure having an outer edge overlying said peripheral portion and an inner edge overlying said one or more gaps, and one or more electrically conductive leads overlying the top surface of said support structure, each said lead having a first end secured to said central portion and a second end overlying one of said gaps and being secured to the inner edge of said bus;

(b) juxtaposing said support structure with a semiconductor chip including a front face having contacts so that the bottom surface of said support structure opposes said front face;

(c) bonding said one or more leads to said contacts by detaching the second ends of said one or more leads from said bus and displacing said one or more leads relative to said support structure so that each said second end engages one of said contacts;

(d) allowing a curable liquid material to flow between said semiconductor chip and said support structure, whereby said curable liquid wets to the inner edge of said bus and curing the curable liquid.

2. A method as claimed in claim 1, wherein the step of allowing a curable material to flow includes the steps of:

attaching a protective layer on the top surface of said support structure so as to cover said one or more gaps;

depositing said curable material around at least a portion of the periphery of said semiconductor chip after attaching the protective layer so as to encapsulate the bonded leads.

3. A method as claimed in claim 1, wherein each said lead comprises:

a first end securement section integrally connected to said central portion of said support structure;

a second end securement section integrally connected to the inner edge of said bus;

a connection section disposed between said first end securement section and said second end securement section, said connection section having a first end integrally connected to said first end securement section and a second end connected to said second end securement section;

a frangible section connecting the second end of said connection section to said second end securement section.

4. A method as claimed in claim 3, wherein during the bonding step the second end of the connection section is broken away from said frangible section.

5. A method as claimed in claim 4, wherein said second end securement section remains integrally connected to the inner edge of said bus after the bonding step.

6. A method as claimed in claim 5, wherein said second end securement section projects slightly toward said semiconductor chip after the bonding step.

7. A method as claimed in claim 6, wherein during the allowing a curable liquid material to flow step said curable liquid material wets to the second end securement sections integrally connected to the inner edge of said bus.

8. A method as claimed in claim 1 wherein said curable liquid material includes a curable silicone elastomer.

9. A method as claimed in claim 1, wherein said bus includes a plurality of metallic bars connected to one another to cooperatively form a hoop-like structure.

10. A method as claimed in claim 1, wherein said bus includes two metallic bars on opposite sides of said central portion, said bars being substantially parallel to one another.

11. A method as claimed in claim 1, wherein said support structure further comprises one or more bridge elements disposed at spaced apart locations around the periphery of said central portion for integrally connecting said central portion and said peripheral portion together.

12. A method as claimed in claim 11, wherein said semiconductor chip includes rows of peripheral contacts forming a generally rectangular pattern, said rows of peripheral contacts terminating before the corners of said rectangular pattern, said corners of said pattern being substantially devoid of said contacts.

13. A method as claimed in claim 11, wherein said one or more bridge elements overlie said corners of said pattern.

14. A method as claimed in claim 3, wherein said support structure includes terminals on the top surface thereof which are connected to the first end securement section of said leads.

15. A method as claimed in claim 14, wherein said support structure further includes compliant material between said top surface and said bottom surface for permitting displacement of said terminals.

16. A method as claimed in claim 15, wherein said compliant material includes a plurality of pads defining channels therebetween, said curable material flowing into said channels during the allowing a curable material to flow step.

17. A method as claimed in claim 3, wherein a plurality of said connection sections extend across said one or more gaps, at least some of said connection sections being substantially straight and parallel to one another.

18. A method as claimed in claim 16, wherein said at least some of said connection sections are substantially perpendicular to the inner edge of said bus.

* * * * *